US012671060B2

(12) United States Patent
Gorath

(10) Patent No.: US 12,671,060 B2
(45) Date of Patent: Jun. 30, 2026

(54) MICROWAVE TREATMENT DEVICE

(71) Applicant: Muegge GmbH, Reichelsheim (DE)

(72) Inventor: Moritz Johann Gorath, Reichelsheim (DE)

(73) Assignee: Muegge GmbH, Reichelsheim (DE)

( * ) Notice: Subject to any disclaimer, the term of this patent is extended or adjusted under 35 U.S.C. 154(b) by 760 days.

(21) Appl. No.: 17/926,271

(22) PCT Filed: Mar. 25, 2021

(86) PCT No.: PCT/EP2021/057760
§ 371 (c)(1),
(2) Date: Nov. 18, 2022

(87) PCT Pub. No.: WO2021/233597
PCT Pub. Date: Nov. 25, 2021

(65) Prior Publication Data
US 2023/0207273 A1 Jun. 29, 2023

(30) Foreign Application Priority Data

May 19, 2020 (DE) ...................... 10 2020 113 578.5

(51) Int. Cl.
H01J 37/32 (2006.01)
H05B 6/68 (2006.01)
(Continued)

(52) U.S. Cl.
CPC ..... H01J 37/3222 (2013.01); H01J 37/32311 (2013.01); H05B 6/68 (2013.01);
(Continued)

(58) Field of Classification Search
CPC ............. H01J 37/32192; H01J 37/3222; H01J 37/32311; H05B 2206/044; H05B 6/68; H05B 6/72; H05B 6/76; H05B 6/782
(Continued)

(56) References Cited

U.S. PATENT DOCUMENTS 5,874,715 A * 2/1999 Choi ...................... H05B 6/705
219/745
2009/0159214 A1 6/2009 Kasai
(Continued)

FOREIGN PATENT DOCUMENTS

CN 109982500 A 7/2019
DE 4240104 A1 6/1994
(Continued)

OTHER PUBLICATIONS

Translation of WO2011125470, "Plasma processing device and plasma processing method", Oct. 13, 2011, By WIPO. (Year: 2011).*

*Primary Examiner* — Quang T Van
(74) *Attorney, Agent, or Firm* — Smartpat PLC

(57) ABSTRACT

A microwave treatment device includes a treatment chamber, in which an object to be treated can be arranged, and a microwave emission device, by which microwave radiation can be radiated into the treatment chamber or emitted therein. The microwave emission device includes at least one array antenna with a plurality of individual emitters and a microwave control device which can be used to specify an emission characteristic for each individual emitter of the at least one array antenna. A phase and/or amplitude of the microwave emission can be specified for each individual emitter by the microwave control device. A phase and/or an amplitude of the microwave emission can be specified for each individual emitter by the microwave control device. Furthermore, a frequency of the microwave emission can be specified within a frequency range for each individual emitter by the microwave device.

7 Claims, 8 Drawing Sheets

(51) Int. Cl.
    *H05B 6/72*           (2006.01)
    *H05B 6/76*           (2006.01)
    *H05B 6/78*           (2006.01)

(52) U.S. Cl.
    CPC ................. *H05B 6/72* (2013.01); *H05B 6/76*
             (2013.01); *H05B 6/782* (2013.01); *H05B*
                  *2206/044* (2013.01)

(58) Field of Classification Search
    USPC ....... 219/699, 696, 697, 691, 693, 745, 746,
                    219/748, 750; 118/337, 723, 317,
                              118/723 MW
    See application file for complete search history.

(56)                 References Cited

U.S. PATENT DOCUMENTS

| | | | |
|---|---|---|---|
| 2013/0175262 A1* | 7/2013 | Gharpurey | ............... H05B 6/72 |
| | | | 219/745 |
| 2017/0133202 A1 | 5/2017 | Berry, III | |
| 2017/0346190 A1 | 11/2017 | Kim et al. | |
| 2019/0182910 A1* | 6/2019 | Huang | .................... H05B 6/68 |

FOREIGN PATENT DOCUMENTS

| | | |
|---|---|---|
| EP | 0459177 A2 | 12/1991 |
| KR | 20070070593 A | 7/2007 |
| WO | 9912184 A2 | 3/1999 |
| WO | 2011125470 A1 | 10/2011 |

\* cited by examiner

MICROWAVE TREATMENT DEVICE

TECHNICAL FIELD

The disclosure relates to a microwave treatment device comprising a microwave emission device by which microwave radiation can be radiated into a treatment chamber or emitted therein.

BACKGROUND

Various microwave treatment devices are known from practice, which can be used for very different purposes and in very different fields of application. Microwave treatment devices can be used for warming, for example for heating, an object by irradiation with microwaves. Such microwave treatment devices are used for example in brief heating and sterilization of prepared and pre-made food, or for heating this immediately before it is eaten. Other microwave treatment devices are intended and designed for generating a plasma, maintained using microwave radiation, in a treatment chamber, in order, for example, to provide an object, to be treated, in the treatment chamber with a plasma-induced coating.

In this case, the object can be introduced into a treatment chamber prior to being treated, and the treatment chamber can be closed during the treatment duration, in order, for example, to prevent undesired escape of microwave radiation from the closed treatment chamber during the treatment duration. Microwave treatment devices are also known in which the treatment chamber comprises an inlet opening and an outlet opening, and the object to be treated can be conveyed into the treatment chamber, and out of the treatment chamber again following completed treatment, by means of a conveying device, wherein a continuous conveyance of the object through the treatment chamber during the treatment duration is also possible.

An essential aspect of the microwave treatment devices of this kind is that of generating the microwave radiation which is intended to be provided in the treatment chamber for the treatment of the object to be treated. The microwave radiation is routinely generated outside of the treatment chamber. In many case, the microwave radiation is guided from a microwave generation device to the treatment chamber via waveguides.

The microwave radiation can for example be emitted directly outside the treatment chamber, by horn radiators, and radiated into the treatment chamber via openings in the treatment chamber. In this case, the openings are typically closed by a microwave-permeable material, such as quartz glass, in order to be able to fill the treatment chamber with a suitable medium which allows or at least supports the desired treatment of the object. Furthermore, in a treatment chamber closed in this way, advantageous pressure ratios such as an excess pressure or vacuum can be generated. Microwave treatment devices are also known in which the microwave radiation are introduced into the treatment chamber by suitable antenna, for example by rod antennae protruding into the treatment chamber, or by waveguide systems, and emitted in the treatment chamber. Coupling in of the microwave radiation from outside the treatment chamber is then not required.

In many cases, the treatment chamber is designed as a resonator, in order to be able to bring about a radiation distribution of the microwave radiation, inside the treatment chamber, which is as constant and as precisely known as possible. In the case of a radiation distribution that is firmly specified by the design of the microwave emission device and the treatment chamber, it is almost impossible to adjust the microwave treatment device to different objects or treatment methods, in order to allow for treatment of the objects that is as efficient as possible in each case, despite different specifications.

In the case of some microwave treatment devices known from practice, the microwave emission device can be changed for example with respect to its arrangement or orientation relative to the treatment chamber, in order to bring about different radiation distributions inside the treatment chamber, such that an adjustment to different objects or treatment parameters is possible. However, the outlay for such modification of a microwave treatment device is comparatively high.

SUMMARY

An object of the present disclosure is therefore considered to be that of improving a microwave treatment device known from the prior art in such a way that a change in the radiation distribution inside a treatment chamber, and thereby an adjustment of the radiation distribution inside the treatment chamber to different objects or treatment parameters is made possible with the least possible outlay and in a short time.

This object is achieved in that the microwave emission device comprises at least one array antenna having a plurality of individual emitters, and a microwave control device by means of which an emission characteristic can be specified for each individual emitter of the at least one array antenna. The use of an array antenna comprising a plurality of individual emitters which can be actuated individually makes it possible for an intensity distribution inside the treatment chamber, resulting from the superimposition of the microwave radiation emitted by the individual emitters, to be varied and adjusted to the respective requirements or specifications in a simple manner. In this case, it is not necessary for the microwave emission device to be shifted relative to the treatment chamber or for a mechanical adjustment of the microwave emission device to be carried out. The dimensions of the individual emitters, and the number and arrangement thereof within the at least one array antenna, can be specified largely arbitrarily and adjusted to the treatment chamber desired in the individual case, and to the intended use in each case.

It has been found that an individual emitter typically does not have an emission characteristic particularly suitable for a microwave treatment device. However, in the case of a combination of a plurality of individual emitters to form an array antenna, the individual emitters can be actuated, and prompted to emit microwaves, in such a way that an emission characteristic which is very advantageous for a microwave treatment device can be achieved using the array antenna. In this case, an emission characteristic suitable for particular cases of use can already be generated using an array antenna comprising merely 3×3, or even fewer, individual emitters. However, for many cases of use, it is desirable for an emission characteristic which can be more strongly influenced and better adjusted to the respective case of use to be able to be achieved using array antennas comprising for example 5×5 or more individual emitters arranged in a matrix-like manner. In addition to square arrangements, rectangular or polygonal, or circular or oval, arrangements of the individual emitters in an array antenna, as well as the combination of a plurality of identical or differently designed array antennas, are also possible.

The dimensions of an individual emitter are expediently adjusted to the frequency, used in each case, of the microwaves to be emitted, and correspond for example at least to a wavelength of λ/4. In the case of a frequency of the microwaves, suitable for many cases of use, of 2.45 GHz, the dimensions of an individual emitter are approximately 3×3 cm. An approximately rectangular or square footprint is considered advantageous in this case. Particularly advantageous emission characteristics of an array antenna can be achieved by individual emitters having an approximately square footprint, wherein in the case of two opposite corners, the footprint is delimited by a diagonal extending at an angle of 45° to the adjoining side walls, instead of by the relevant corner. The individual emitters are advantageously dimensioned and actuated such that a circularly polarized microwave is emitted.

Using at least one array antenna makes it possible, in principle, for the treatment chamber not to have to be delimited by a housing or for example a vacuum chamber. An array antenna makes it possible for the emitted microwave power to be focused in a spatial region at a distance from the array antenna, without resonance conditions having to be specified, for example using an electrically conductive housing. It is thus possible, for example, for an object located in the vicinity of the array antenna to be warmed by the microwaves emitted by the array antenna, without a closed housing being required.

In order to limit undesired propagation of microwaves beyond the treatment space required for treating an object, the use of a treatment chamber which impedes or prevents the propagation of microwaves beyond the treatment space may be expedient. Even in the case of a single array antenna, and in particular when using a plurality of array antennas, the overall emitted microwave power can be variably directed and focused within a region, such that an adjustment of the emitted microwave power to different objects or ambient conditions is possible in a simple manner. When using merely one array antenna, it may be expedient for the array antenna and the treatment chamber of the microwave treatment device to be specified and adjusted to one another, with regard to the respective dimensions and the arrangement of the array antenna in the treatment chamber, such that the microwave treatment device can be emitted inside the treatment chamber, by means of the array antenna, in such a way that the object to be treated can be irradiated completely and efficiently with microwave radiation.

If the microwave treatment device is used for generating a plasma, a treatment chamber may be used which is designed and adjusted with respect to the treatment of objects with the plasma and a limitation of the plasma in the treatment chamber, without complex coupling of the microwaves emitted by the array antenna into the treatment chamber being necessary.

In most cases relevant in practice, the microwave treatment devices are designed such that a spacing between the at least one array antenna and the object to be treated is in the order of magnitude of the characteristic wavelength of the microwave radiation emitted by the individual emitters of the array antenna. The object to be treated is then located in the near field, or in an intermediate region between the near field and the far field of the array antenna, such that a retroactive effect of the surroundings, and in particular of the object to be treated, on the characteristic emission of the microwaves is possible using the at least one array antenna, and should be taken into account.

The individual emitters can be supplied with the energy required for emitting the microwave radiation in various ways. The energy can be supplied to the individual emitters via an electromagnetic waveguide, such as a coaxial conductor or a stripline. It is also conceivable for the energy to be transmitted to the individual emitters in a contactless manner, or without an electromagnetic waveguide, for example by means of inductive or capacitive transmission methods.

According to an advantageous embodiment, it is provided that a phase and/or an amplitude of the microwave emission can be specified for each individual emitter by means of the microwave control device. It is also conceivable that, either for the at least one array antenna or for each individual emitter, a frequency of the emitted microwave radiation can be specified, and optionally also changed during operation of the microwave treatment device. A suitable change and specification of the parameters mentioned above makes it possible to specify the position and intensity of maxima and minima of the resulting distribution of the microwave radiation within the treatment chamber, during an operating duration of an object to be treated, virtually arbitrarily, and to optionally also change it during the treatment duration. Thus, novel treatment methods for the object to be treated are also possible. It is thus possible, for example during the treatment duration, for the arrangement of an intensity maximum of the microwave radiation relative to the object to be treated to be changed, and specifically irrespective of whether the object to be treated is arranged in a stationary manner inside the treatment chamber, or whether it is moved through the treatment chamber by a conveying device during the treatment duration.

The change in a phase or amplitude of the microwave emission of an individual emitter can be triggered and specified in a simple manner, using a suitable microwave control device. For this purpose, the microwave control device can comprise an allocated device, for each individual emitter, for changing and adjusting a phase and optionally also or only an amplitude, by means of which device the phase and optionally also/or the amplitude of the electromagnetic wave supplied to an individual emitter can be influenced and changed. As a result, the phases of the microwave radiation emitted by the individual emitters can be specified, relative to one another, such that in the event of the superposition of the microwave radiation emitted by the individual emitters a desired intensity distribution of the radiation field forms inside the treatment chamber.

It is optionally also possible, and advantageous for various cases of use, if a frequency of the microwave emission can be specified within a frequency range for each individual emitter, by means of the microwave control device. Microwave generators are known from practice which can generate, on the basis of solid-state components, microwaves of a frequency which can be selected and specified as desired, within a frequency range specified by the microwave generator. It is also possible to change the frequency during operation. In this case, it is not necessary to change the geometric dimensions of such solid-state generators so that changes to the frequency of the microwave radiation generated by the solid-state electronics can be carried out automatically, and optionally within a short time period, by said solid-state electronics. The emission characteristic of a single array antenna can be influenced in a varied manner, and adjusted very individually to different cases of use, by means of the various possibilities for influencing the phase, the amplitude or the frequency of the individual emitters.

The at least one array antenna can be arranged outside a treatment chamber or inside the treatment chamber. The treatment chamber can be closed of the duration of treatment of the object to be treated, in order to be able to specify suitable ambient conditions for the object to be treated, during the treatment duration, by means of a process fluid such as a suitable process gas or water. If the array antenna is arranged outside a closed treatment chamber, the treatment chamber expediently comprises a microwave-transparent window, through which the microwave radiation emitted by the array antenna can be radiated into the treatment chamber.

Advantageously, it is optionally provided for at least one array antenna to be arranged inside a housing which surrounds the treatment chamber and is made of an electrically conductive material. By means of the array antenna arranged inside the treatment chamber, the microwave radiation can be generated inside the treatment chamber and emitted therein. The surrounding housing made of an electrically conductive material makes it possible for undesired emission of microwave radiation into the surroundings of the treatment chamber to be reduced as far as possible. In this way, a comparatively efficient treatment of the object to be treated, by microwave radiation, is possible, wherein it is simultaneously possible to achieve, and optionally ensure, that no microwave radiation, or merely a very small fraction of the microwave radiation generated by the array antenna, can escape from the treatment chamber into the surroundings.

In order to allow for continuous operation of the microwave treatment device, according to one embodiment it is provided for the treatment chamber to comprise an inlet opening and an outlet opening for introducing and removing the object to be treated, as well as a conveying device by means of which the object to be treated can be conveyed through the inlet opening into the treatment chamber and, following treatment by microwave radiation, can be conveyed through the outlet opening and out of the treatment chamber. Depending on the respective embodiment of the treatment chamber, the inlet opening and the outlet opening can be formed by a single opening in the treatment chamber, and the conveying device can convey the object to be treated through said one opening into the treatment chamber, and subsequently out of the treatment chamber again, after the treatment duration. In many cases, however, it is expedient for the conveying device to comprise a conveyor belt or conveying path extending through the treatment chamber, from an inlet opening to an outlet opening spaced apart therefrom, such that the objects to be treated can be successively and continuously conveyed through the inlet opening into the treatment chamber, treated with the microwave radiation inside the treatment chamber, and subsequently conveyed out of the treatment chamber again through the outlet opening.

In this case, microwave radiation can be emitted either continuously or at time intervals, for a specific treatment duration in each case, using the array antenna. The inlet opening and the outlet opening can be closed, or covered, in part or completely if no object to be treated is located in the region of the inlet opening or the outlet opening, in order to reduce the fraction of microwave radiation undesirably escaping through the inlet opening or outlet opening. The conveying device can comprise a microwave-transparent conveyor belt which runs through the treatment chamber and on which the objects to be treated can be arranged and conveyed through the treatment chamber.

According to a particularly advantageous, it is provided for a plurality of array antennas to be arranged inside the treatment chamber in such a way that the object to be treated can be irradiated from different directions by the microwave radiation emitted by one array antenna in each case. The plurality of array antennas can be operated for example at different frequencies of the microwave radiation. Frequency ranges which are often used are for example the ranges between 900 and 930 MHz, between 2.4 and 2.5 GHz, or between 5.725 and 5.875 GHz. A large number of different microwave generation devices are available and can be obtained commercially for microwave radiation in these frequency ranges. For example, food can be warmed or sterilized using microwave radiation from these frequency ranges. However, other frequency ranges or intended uses are also conceivable.

Arranging a plurality of array antennas inside the treatment chamber makes it possible for the object to be treated to be irradiated with microwave radiation from different directions, as a result of which for example quicker and more uniform warming of the object to be treated is possible compared with microwave radiation emitted only from one direction. The plurality of array antennas can be identical in design, and merely arranged and oriented differently within the treatment chamber, as a result of which the production outlay for the plurality of array antennas can be reduced. It is also conceivable for the plurality of array antennas to be of different dimensions and shapes, in order to be able to have different radiation characteristics in the emission of the microwave radiation, which characteristics can advantageously be used for treating the objects to be treated. The plurality of array antennas can also operate at different frequencies and accordingly emit different microwave radiation.

In view of a production of the microwave emission device that is as cost-effective as possible, and operation thereof that is as reliable as possible, it is optionally provided for the individual emitters of the at least one array antenna to each be designed as a patch antenna. A patch antenna comprises a typically rectangular or square metal surface, wherein a length of a long side of the rectangular metal surface is expediently adjusted to the characteristic wavelength of the microwave radiation which is intended to be emitted by the patch antenna. Patch antennas of a planar or curved shape are also possible, which shapes deviate from a rectangular or square shape. The emission characteristic of the patch antenna can be influenced and suitably specified by the adjustment of a suitable shape. It is also conceivable for the patch antennas within the at least one array antenna or in a plurality of array antennas designed uniformly in each case to be of a different shape or a shape deviating from one another. An individual patch antenna and in particular a cell-like or matrix-like arrangement of a plurality of patch antennas within the at least one array antenna can be produced in a cost-effective manner by means of known production methods. On account of the patch antenna substantially made up of planar structures and components, the patch antennas require only a small amount of installation space. Furthermore, the patch antennas can be produced from cost-effective materials and can be designed so as to be largely insensitive to the ambient conditions prevailing inside the treatment chamber.

Patch antenna structures deviating from one another can also be formed and operated together within the at least one array antenna. It is also conceivable for multi-layered sequences of layers of electrically conductive metal and electrically non-conductive dielectric materials to form an individual emitter. Additional components may also be arranged within an array antenna, in order to direct the microwave radiation, emitted by the array antenna, in a suitable manner, and prevent undesired reflections.

According to an advantageous embodiment, it is provided for an antenna lens device to be arranged between the at least one array antenna and the object to be treated, by means of which antenna lens device microwave radiation emitted by the array antenna or by at least one individual emitter of the array antenna can be deflected or focused. For this purpose, for example some individual emitters or all the individual emitters of an array antenna can be covered, in part or entirely, with a microwave-conducting material such as quartz glass, sapphire glass, or polytetrafluoroethylene, in order to influence the radiation properties of the array antenna. An antenna lens device of this kind makes it possible to achieve an increase in the fraction of the microwave radiation emitted by the array antenna in the direction of the object to be treated, and to reduce another fraction of the microwave radiation which cannot be used for treating the object to be treated.

According to a particularly advantageous embodiment, it is provided for the microwave treatment device to comprise at least one anti-leakage array antenna, which can be oriented and actuated such that microwave radiation of the at least one array antenna emerging through the inlet opening and/or through the outlet opening undergoes destructive superposition, and the emerging intensity of the microwave radiation is reduced as a result. In this way, an undesired escape of microwave radiation from the treatment chamber can be significantly reduced, even in the case of a partially or completely open inlet opening or outlet opening. As a result, the efficiency of the microwave treatment device can be improved, such that a comparable or improved treatment of the object to be treated is possible, with a lower energy output. Furthermore, the structural outlay required for safe operation of the microwave treatment device and for appropriate shielding of the surroundings from the microwave radiation emitted in the process can be reduced.

It is also possible for one or more anti-leakage array antennas to be used in a microwave treatment device which does not comprise a treatment chamber or a housing that surrounds a treatment space. The anti-leakage array antennas can then be arranged and operated in such a way that the propagation of the microwave power, emitted by the array antennas, beyond the treatment space, in one spatial direction or in a plurality of spatial directions, is suppressed or almost entirely prevented. In this way, a suitable arrangement of array antennas and anti-leakage array antennas makes it possible to specify a treatment space that is not delimited by a housing, within which space the emitted microwave power can be used for treating an object, and outside which no excessive further propagation of the microwaves occurs, at least in one or in a plurality of spatial directions.

Embodiments, by way of example, of the inventive concept are explained in greater detail in the following and shown schematically in the drawings.

DETAILED DESCRIPTION

Figure 1:
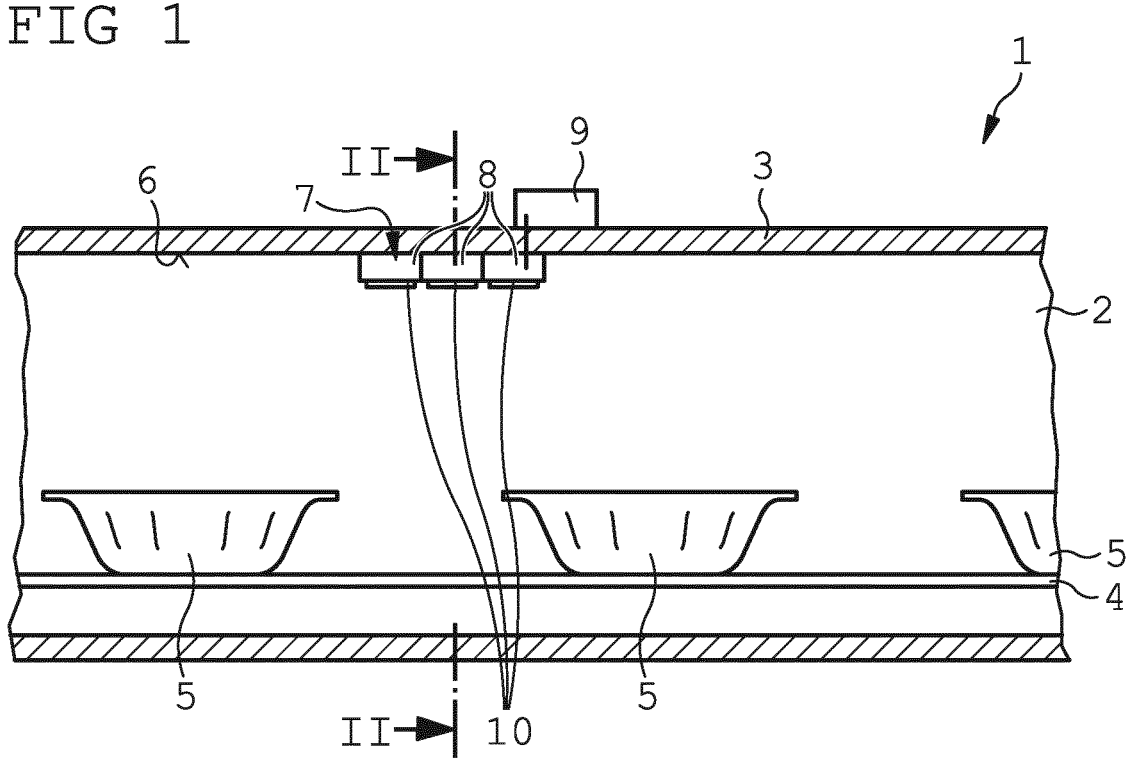
FIG. 1 is a cross section through a treatment chamber of a microwave treatment device, through which objects to be treated are conveyed by a conveying device and in which an array antenna made of a plurality of individual emitters is arranged, by means of each of which emitters microwave radiation can be emitted.
Figure 2:
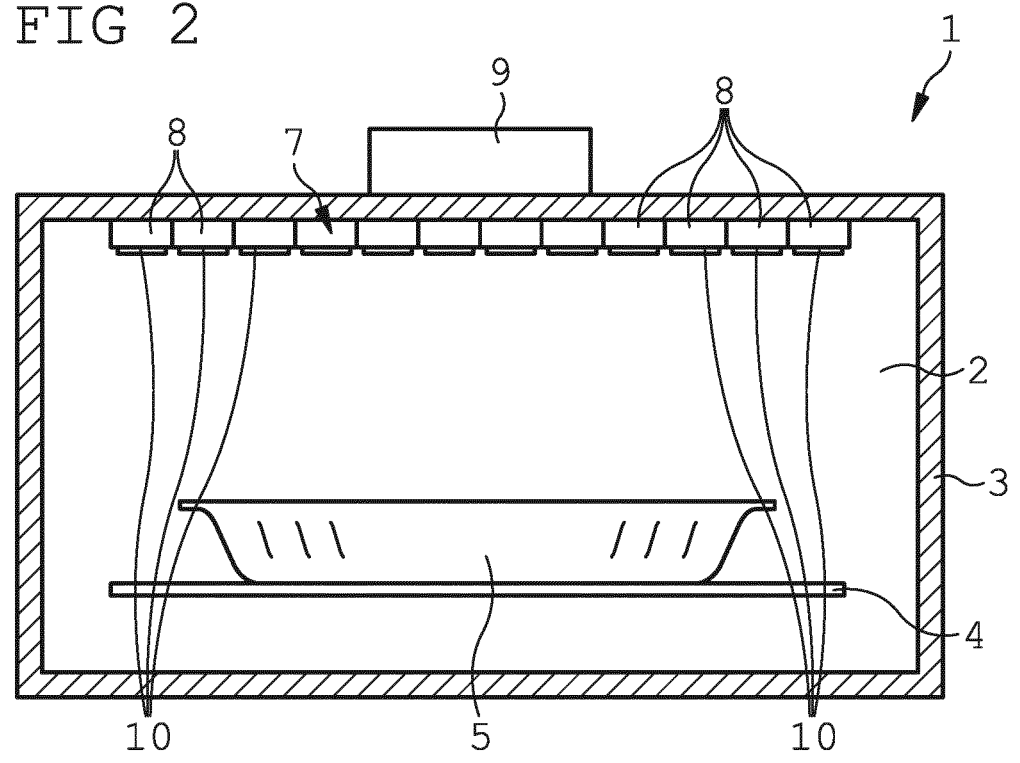
FIG. 2 is a cross section of the treatment chamber shown in FIG. 1, along a line II-II in FIG. 1.

FIGS. 1 and 2 show a microwave treatment device 1 in two different cross-sectional views. The microwave treatment device 1 comprises a treatment chamber 2 which is surrounded by a housing 3 made of an electrically conductive material, such as metal. A conveyor belt 4 of a conveying device extends through the treatment chamber 2. A plurality of objects 5 to be treated are arranged on the conveyor belt 4, in a manner spaced apart from one another in each case. The objects 5 can for example be closed food containers, which are filled with a prepared meal which is intended to either be sterilized prior to storage or to be warmed directly before eating, using the microwave treatment device 1. The individual objects 5 are conveyed continuously through the treatment chamber 2, using the conveyor belt 4.

An array antenna 7 is arranged on an inside wall 6 of the housing 3 surrounding the treatment chamber 2. The array antenna 7 comprises a plurality of individual emitters 8 arranged in a matrix-like manner. Microwave radiation can be emitted by each individual emitter 8 of the array antenna 7. The individual emitters 8 are actuated by a microwave control device 9, such that the emission of microwave radiation of the individual emitters 8 of the array antenna 7 can be specified independently of one another and separately for each individual emitter 8, using the microwave control device 9. The microwave radiation emitted by the individual emitters 8 of the array antenna 7 during treatment of the objects 5 to be treated is superimposed within the treatment chamber 2, wherein different intensity distributions of the emitted microwave radiation within the treatment chamber 2 result, depending on the actuation of the individual emitters 8.

Figure 3:
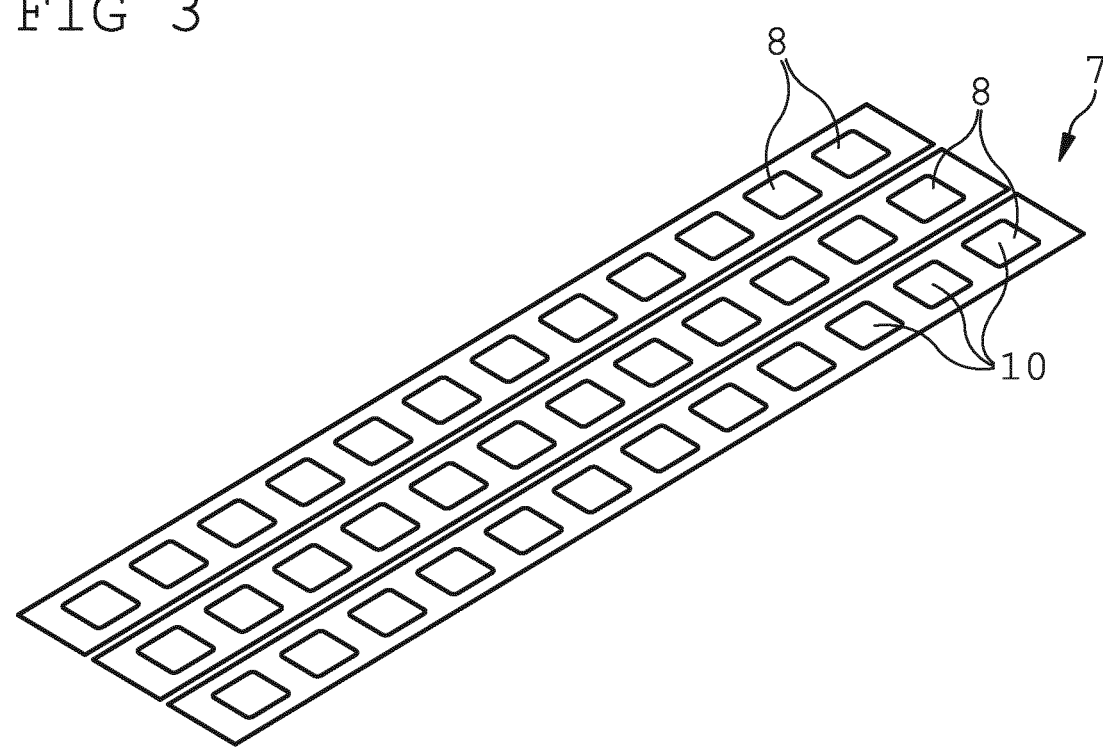
FIG. 3 is a perspective view of an array antenna which is made of a matrix-like arrangement of 3×12 individual emitters.

FIG. 3 shows, merely by way of example, an embodiment of the array antenna 7. The array antenna 7 comprises a total of 36 individual emitters 8, which are arranged in the manner of a matrix, in three rows and twelve columns. Each individual emitter 8 is designed as a patch antenna and comprises a rectangular metal plate 10 at a facing the object 5 to be treated in the treatment chamber 2, which can be excited to emit microwave radiation. The dimensions of a long side of the metal plate 10 of the individual emitters 8 are adjusted to the characteristic wavelength λ of the microwave radiation which is emitted by the individual emitters 8. Each individual emitter 8 is assigned a device (not shown separately in the figures) for changing and adjusting a phase or a phase angle, and optionally an amplitude, of the microwave radiation emitted by the individual emitter 8, such that, for each individual emitter 8 of the array antenna 7, the phase thereof and the amplitude of the emitted microwave radiation can be freely specified. As a result, an intensity distribution of a radiation field, which results from the superimposition of the microwave radiation of the individual emitters 8, can be influenced in a varied manner and adjusted for example to different objects or different treatment methods.

FIGS. 4 to 11 show four different emission modes, by way of example, which can be achieved by suitable actuation of the microwave control device 9 comprising the array antenna 7 shown in FIGS. 1 to 3 in the treatment chamber 2.

Figure 4:
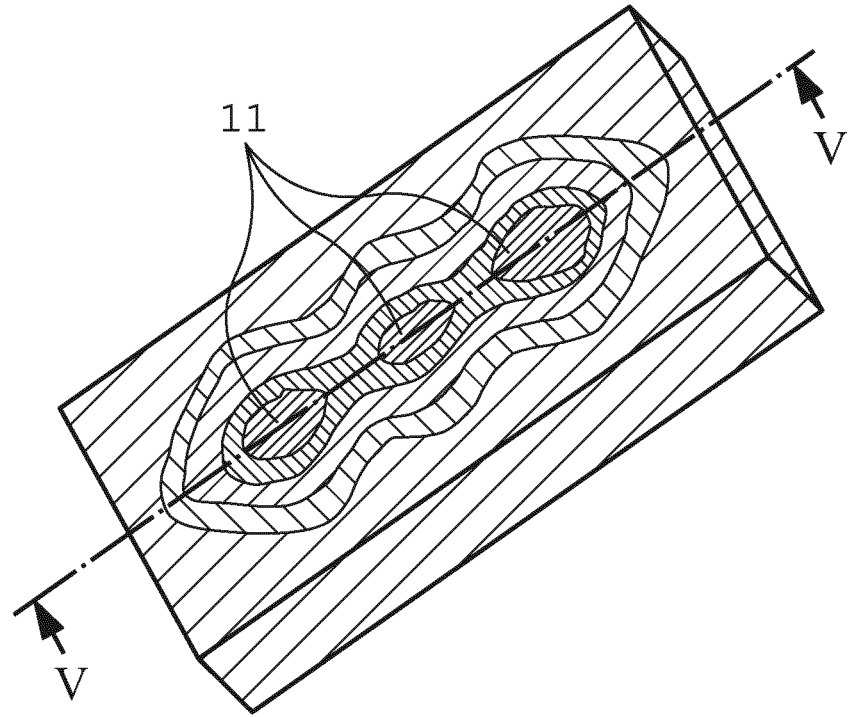
FIG. 4 is a perspective view of a spatial distribution of the microwave power density emitted by the array antenna, in a region close to the array antenna.
Figure 5:
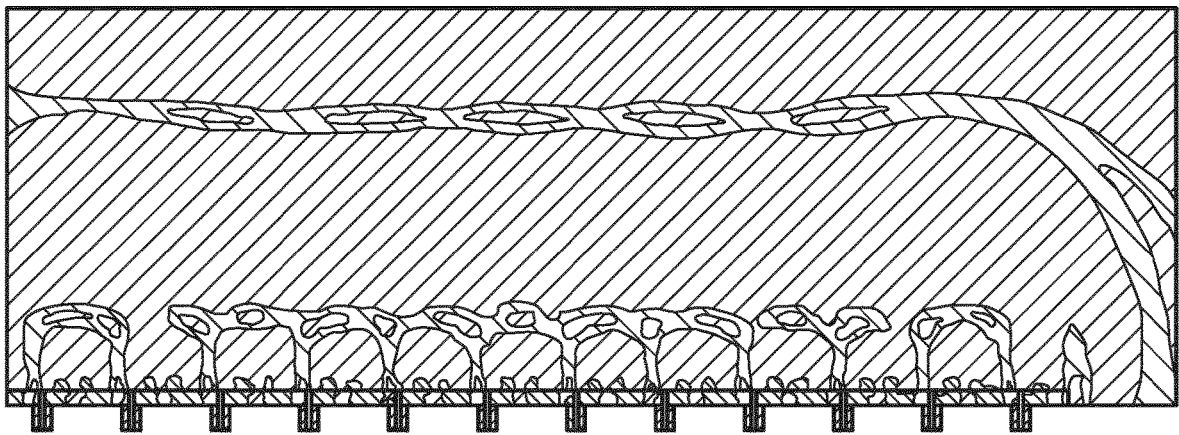
FIG. 5 is a cross section of an emitted E-field distribution in the case of the spatial distribution of the microwave power density shown in FIG. 4, along a line V-V in FIG. 4.

FIGS. 4 and 5 are a perspective view and a cross section of a first emission mode, in which the intensity and the phase of all the individual emitters 8 are specified in an identically corresponding manner, and an initially homogeneous emission of the microwave radiation, shown in FIG. 5, forms, wherein a plurality of intensity maxima 11 specified by the treatment chamber 2 then form inside the treatment chamber 2, which maxima, however, are all oriented towards the object to be treated and are uniformly spaced apart from one another. FIG. 5 is a cross section through an E-field distribution which occurs in the case of the spatial distribution of the emitted microwave power density shown in FIG. 4.

Figure 6:
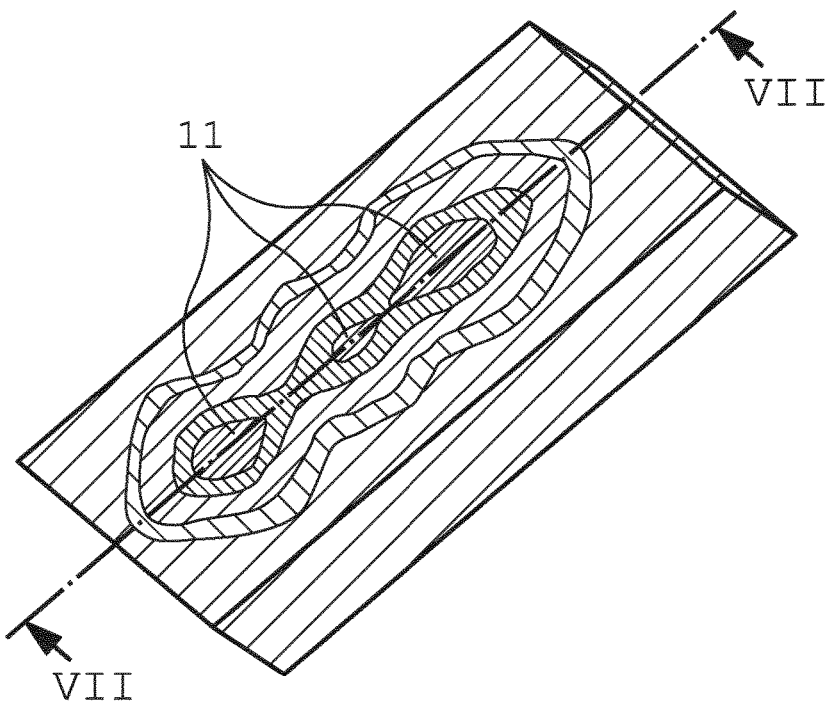
FIG. 6 is a perspective view of a spatial distribution of the microwave power density emitted by the array antenna, which is generated by a deviating actuation of the individual emitters of the array antenna.
Figure 7:
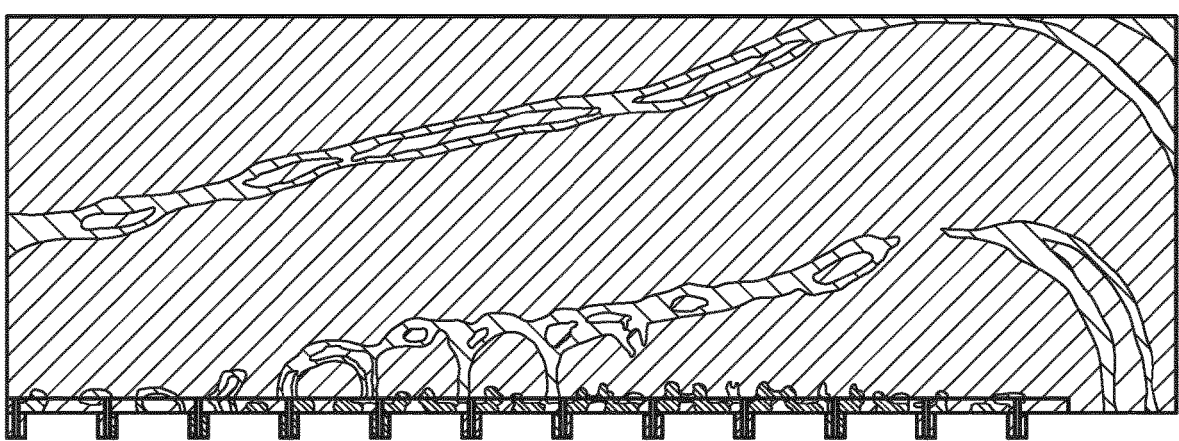
FIG. 7 is a cross section of an emitted E-field distribution in the case of the spatial distribution of the microwave power density shown in FIG. 6, along the line VII-VII in FIG. 6.

FIGS. 6 and 7 are a perspective view and a cross section of a second emission mode, in which the phase of the individual emitters 8 is identical within each row, but there is a temporally successive phase shift for the twelve rows. As a result, an arrangement and distribution of the intensity maxima 11 deviating from one another forms in a direction which, in the embodiments shown in FIGS. 1 to 3, is directed transversely to a conveying direction of the object 5 through the treatment chamber 2.

Figure 8:
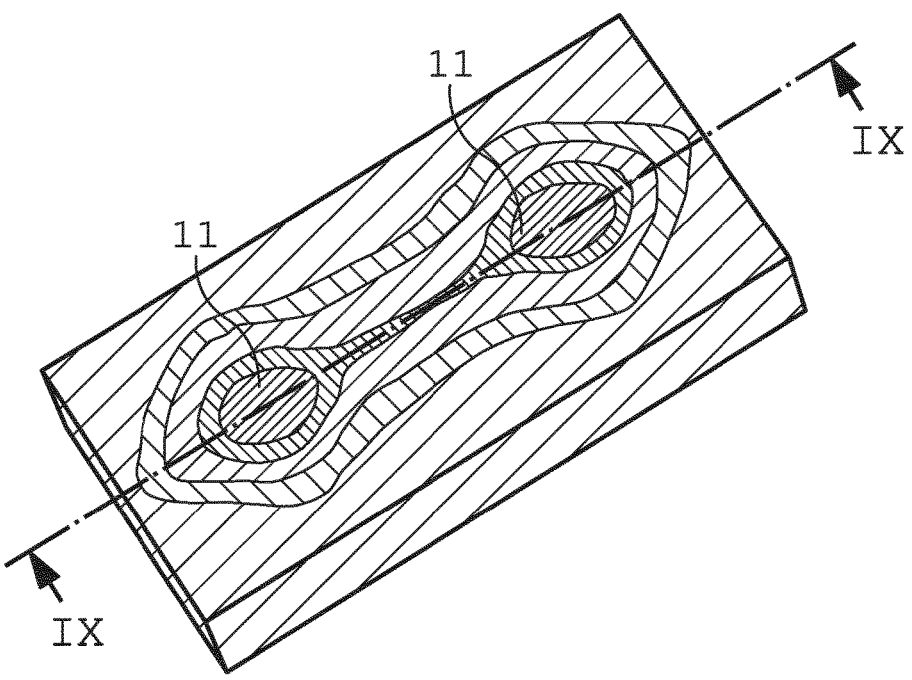
FIG. 8 is a perspective view of a spatial distribution of the microwave power density emitted by the array antenna, which is generated by another deviating actuation of the individual emitters of the array antenna.
Figure 9:
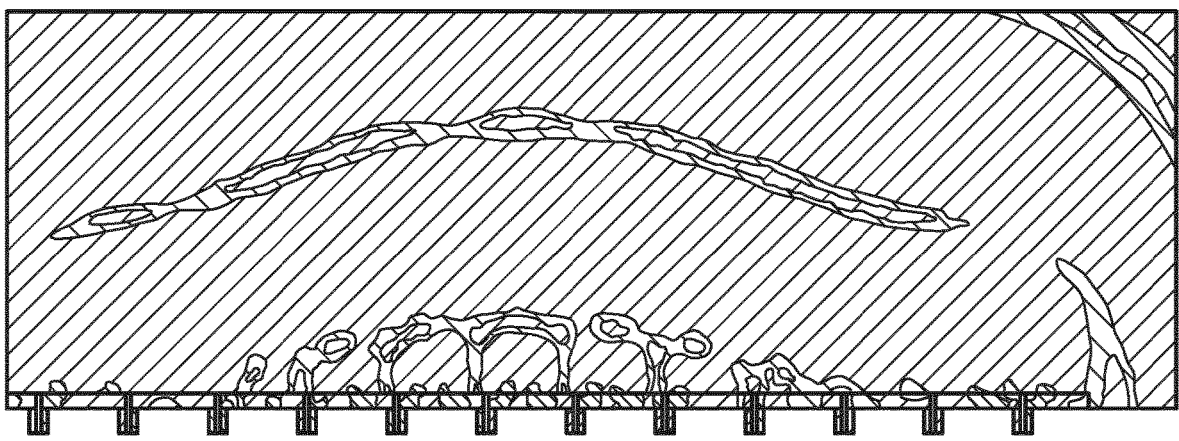
FIG. 9 is a cross section of an emitted E-field distribution in the case of the spatial distribution of the microwave power density shown in FIG. 8, along a line IX-IX in FIG. 8.

FIGS. 8 and 9 are a perspective view and a cross section of a third emission mode, in which the phase of the individual emitters 8 of the central lines is slightly lagged towards the outside in each case, wherein a radiation distribution which is restricted to two intensity maxima 11 results in the treatment chamber 2.

Figure 10:
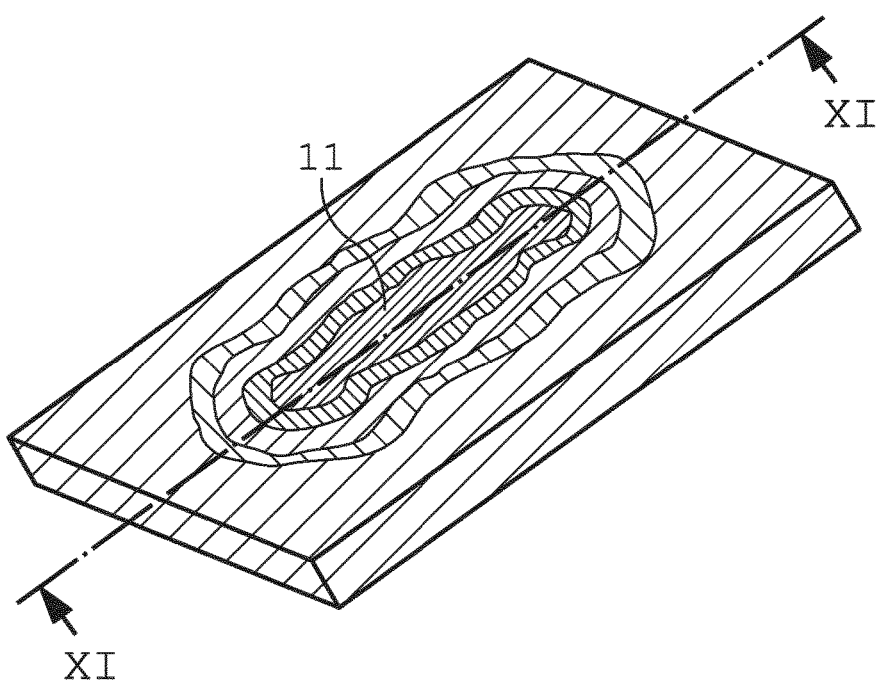
FIG. 10 is a perspective view of a spatial distribution of the microwave power density emitted by the array antenna in the case of another deviating actuation of the individual emitters of the array antenna.
Figure 11:
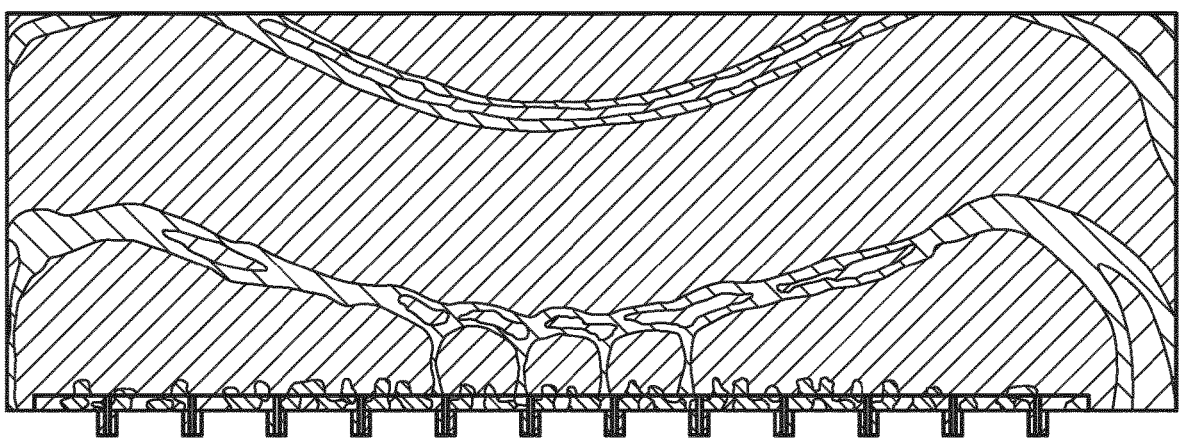
FIG. 11 is a cross section of an emitted E-field distribution in the case of the spatial distribution of the microwave power density shown in FIG. 10, along a line XI-XI in FIG. 10.

FIGS. 10 and 11 are a perspective view and a cross section of a fourth emission mode, in which the phase of the individual emitters 8 of the central lines is specified so as to be slightly leading towards the outside in each case, wherein a radiation distribution which is restricted to a single very wide intensity maximum 11 results in the treatment chamber 2.

Figure 12:
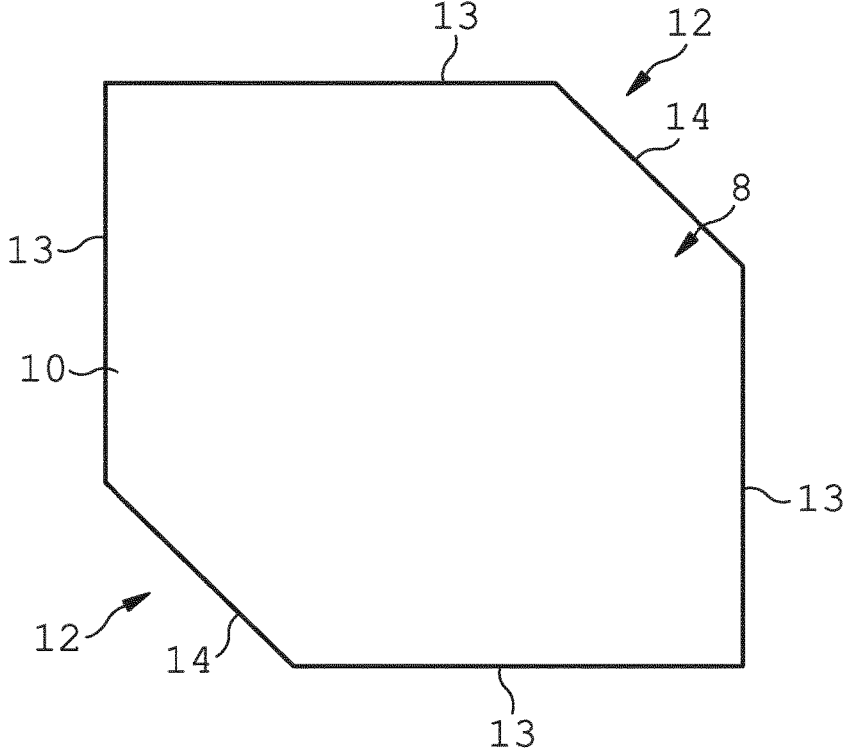
FIG. 12 is a schematic plan view of one individual emitter.

FIG. 12 is a schematic plan view, by way of example, of one individual emitter 8. The metal plate 10 of the individual emitter 8 has an approximately square basic shape, having dimensions of approximately 3 cm×3 cm. In two opposing corner regions 12, the metal plate 10 does not have corners, but rather diagonals 14 extending at an angle of 45° relative to the adjoining side edges 13. Circularly polarized microwaves having a frequency of 2.45 GHz can advantageously be generated and emitted by means of individual emitters 8 of this kind.

Figure 13A:
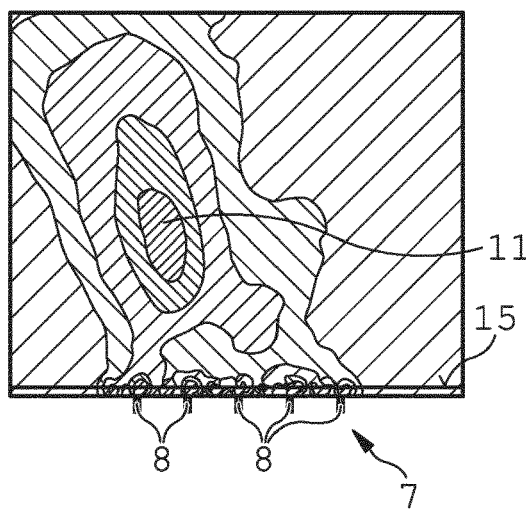
FIGS. 13a to 13c are each cross sections of different intensity distributions which correspond in each case to an emission characteristic generated by an array antenna comprising 5×5 individual emitters, in different operating modes.
Figure 13B:
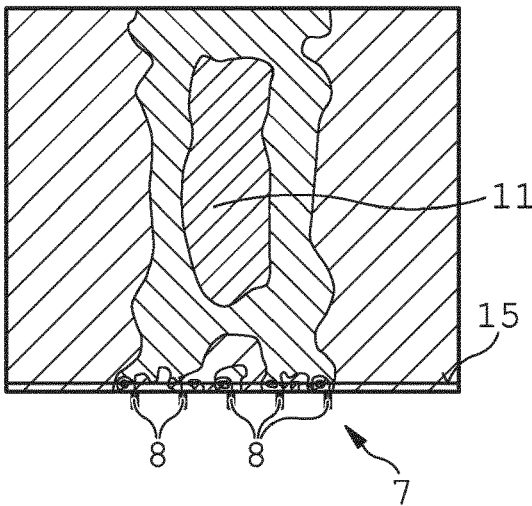
Figure 13C:
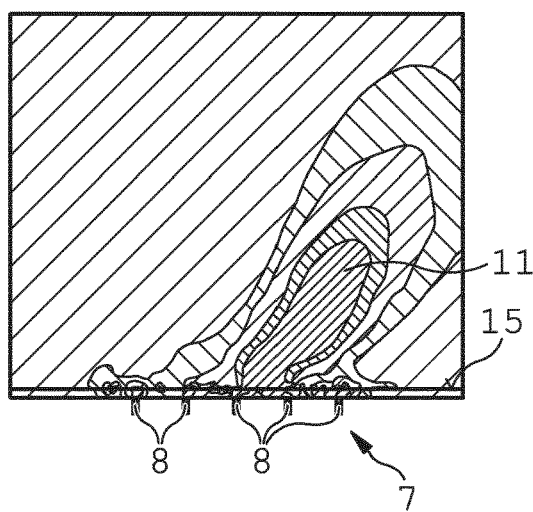

FIG. 13 *a*) to *c*) show various emission characteristics for an array antenna 7 which is made up of a matrix-like planar arrangement of 5×5 individual emitters 8 according to FIG. 12. The cross section shown in FIG. 13 *a*) shows an intensity distribution for a microwave emission in which the emission direction is pivoted towards the left, from an observer, relative to a vertical on an arrangement plane 15 of the individual emitters 8 of the array antenna 7. Actuating the individual emitters 8 not only influences the emission direction, but also generates a comparatively wide intensity maximum 11 at a distance from the arrangement plane 15.

In the emission characteristic shown by way of example in FIG. 13 *b*), an emission directed in the direction of the vertical, on the arrangement plane 15 of the individual emitters 8 of the array antenna 7, is generated, wherein no pronounced intensity maximum 11 is generated in the vicinity of the array antenna 7.

In contrast, in the case of the emission characteristic shown in FIG. 13 *c*), an emission direction pivoted towards the right, from an observer, having a very strongly marked intensity maximum and located close to the arrangement plane 15 of the individual emitters 8 of the array antenna 7, is generated.

These emission characteristics, shown merely by way of example, demonstrate that it is possible, using an array antenna 7, to influence both the emission direction and the formation of an intensity maximum 11 and the spacing thereof from the arrangement plane 15 of the individual emitters 8 of the array antenna 7, and advantageously specify these for a relevant use, by means of suitable actuation of the individual emitters 8.

Figure 14:
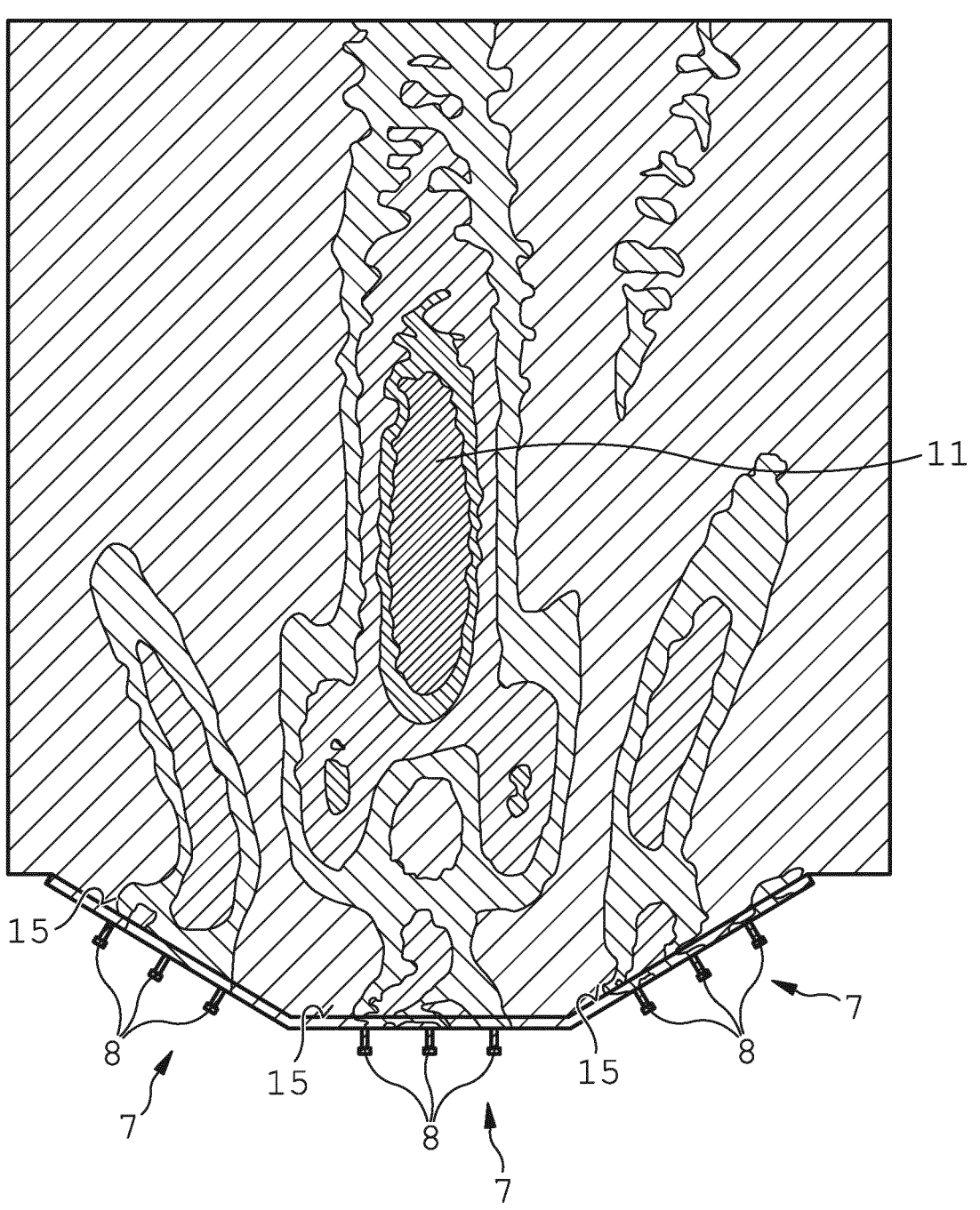
FIG. 14 is a cross section of an intensity distribution of an emission characteristic which is generated by three array antennas oriented at an angle to one another in each case.

FIG. 14 shows, merely by way of example, an emission characteristic for an arrangement of three array antennas 7 having 3×6 individual emitters 8 arranged in a matrix-like manner in each case. In the cross section shown, the sectional plane extends through three individual emitters 8 of the three array antennas 7 in each case. The three array antennas 7 are arranged side-by-side, such that the respective arrangement planes 15 are arranged so as to be inclined by an angle of 30° relative to the adjacent array antenna 7 in each case. Such an arrangement of three array antennas 7 makes it possible to generate the intensity distribution, shown in cross-section in FIG. 14, of the microwave power emitted by the three array antennas 7. A clearly pronounced intensity maximum 11 is generated in a central region, approximately 30 cm above the central array antenna 7. In this case, this emission characteristic, and in particular the intensity maximum 11, have been generated without a surrounding housing. Such an arrangement of array antennas 7 makes it possible for an intensity maximum 11 to be generated in a treatment space, not delimited by an electrically conductive housing, in the vicinity of the array antennas 7, which maximum is sufficient and can be used for generating and forming a plasma.

The invention claimed is:

1. A microwave treatment device (1), comprising:

a microwave emission device, by which microwave radiation can be radiated into a treatment chamber (2) or emitted therein, wherein the microwave emission device comprises at least one array antenna (7) having a plurality of patch antennas (8), and a microwave control device (9) by which an emission characteristic can be specified for each individual emitter (8) of the at least one array antenna (7), and wherein a phase of a microwave emission can be specified for each patch antenna (8) by the microwave control device (9), wherein the microwave control device (9) comprises a phase shifter for each patch antenna, for changing and adjusting the phase of an electromagnetic wave supplied to the respective patch antenna, and wherein the treatment chamber (2) comprises an inlet opening and an outlet opening for introducing and removing an object (5) to be treated, and a conveying device by which the object (5) to be treated can be conveyed through the inlet opening into the treatment chamber (2) and can be conveyed through the outlet opening and out of the treatment chamber (2).

2. The microwave treatment device (1) according to claim 1, wherein an amplitude of the microwave emission can be specified for each patch antenna (8) by the microwave control device (9).

3. The microwave treatment device (1) according to claim 1, wherein a frequency of a microwave emission can be specified within a frequency range for each patch antenna (8) by the microwave control device (9).

4. The microwave treatment device (1) according to claim 1, wherein the at least one array antenna (7) is arranged inside a housing (3) that is made of an electrically conductive material and surrounds the treatment chamber (2).

5. The microwave treatment device (1) according to claim 1, wherein a plurality of array antennas (7) are arranged relative to the treatment chamber in such a way that an object (5) to be treated can be irradiated from different directions by the microwave radiation emitted by one array antenna (7) in each case.

6. The microwave treatment device (1) according to claim 1, wherein an antenna lens device is arranged between the at least one array antenna (7) and an object (5) to be treated, by means of which antenna lens device microwave radiation emitted by the array antenna (7) or by at least one patch antenna (8) of the array antenna (7) can be deflected or focused.

7. The microwave treatment device (1) according to claim 1, further comprising at least one anti-leakage array antenna which is oriented and actuatable such that microwave radiation of the at least one array antenna (7) emerging through the inlet opening and/or through the outlet opening undergoes destructive superposition, and an emerging intensity of the microwave radiation is reduced as a result.

\* \* \* \* \*